(12) United States Patent
Nishiyama et al.

(10) Patent No.: US 12,500,135 B2
(45) Date of Patent: Dec. 16, 2025

(54) SEMICONDUCTOR DEVICE COMPRISING SEMICONDUCTOR ELEMENT; INSULATING COMPONENT; LEAD ELECTRODE; AND FIRST BONDING MATERIAL, SECOND BONDING MATERIAL, THIRD BONDING MATERIAL, AND FOURTH BONDING MATERIAL MADE OF A SAME MATERIAL

(71) Applicant: Mitsubishi Electric Corporation, Tokyo (JP)

(72) Inventors: Masayuki Nishiyama, Tokyo (JP); Rei Yoneyama, Tokyo (JP); Naoki Yoshimatsu, Tokyo (JP); Shintaro Araki, Tokyo (JP); Tatsuya Kawase, Tokyo (JP); Hiroyuki Masumoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 583 days.

(21) Appl. No.: 17/937,701

(22) Filed: Oct. 3, 2022

(65) Prior Publication Data

US 2023/0130373 A1   Apr. 27, 2023

(30) Foreign Application Priority Data

Oct. 26, 2021   (JP) ................................ 2021-174549

(51) Int. Cl.
*H01L 23/373*   (2006.01)
*H01L 23/00*   (2006.01)
(Continued)

(52) U.S. Cl.
CPC ...... *H01L 23/3735* (2013.01); *H01L 23/3107* (2013.01); *H01L 23/473* (2013.01);
(Continued)

(58) Field of Classification Search
CPC ............ H01L 23/3735; H01L 23/3107; H01L 23/473; H01L 24/32; H01L 24/40;
(Continued)

(56) References Cited

U.S. PATENT DOCUMENTS 4,688,899 A * 8/1987 Fujimura ............... G02F 1/1392
349/170
2016/0064302 A1 * 3/2016 Yamada ............ H01L 23/49844
257/703

(Continued)

FOREIGN PATENT DOCUMENTS

JP   2007-184525 A   7/2007
JP   2017-005129 A   1/2017
WO   2017/130370 A1   8/2017

OTHER PUBLICATIONS

An Office Action; "Notice of Reasons for Refusal," mailed by the Japanese Patent Office on Aug. 27, 2024, which corresponds to Japanese Patent Application No. 2021-174549 and is related to U.S. Appl. No. 17/937,701; with English language translation.
(Continued)

*Primary Examiner* — William B Partridge
*Assistant Examiner* — David Paul Sedorook
(74) *Attorney, Agent, or Firm* — Studebaker Brackett PLLC

(57) ABSTRACT

A semiconductor device includes: an insulating layer; a circuit pattern on an upper surface of the insulating layer; a semiconductor element bonded to an upper surface of the circuit pattern through a first bonding material; an insulating component bonded to the upper surface of the circuit pattern through a second bonding material; and a lead electrode connecting the semiconductor element to the insulating component, wherein an upper surface of the semiconductor element is bonded to a lower surface of the lead electrode through a third bonding material, an upper surface of the
(Continued)

insulating component is bonded to the lower surface of the lead electrode through a fourth bonding material, and the first bonding material, the second bonding material, the third bonding material, and the fourth bonding material are made of a same material.

22 Claims, 7 Drawing Sheets

(51) Int. Cl.
      *H01L 23/31*        (2006.01)
      *H01L 23/473*     (2006.01)
      *H01L 25/07*       (2006.01)
      *H02P 27/06*       (2006.01)

(52) U.S. Cl.
    CPC .............. *H01L 24/32* (2013.01); *H01L 24/40* (2013.01); *H01L 24/73* (2013.01); *H01L 25/072* (2013.01); *H01L 2224/32225* (2013.01); *H01L 2224/40139* (2013.01); *H01L 2224/73263* (2013.01); *H01L 2924/01029* (2013.01); *H01L 2924/01047* (2013.01); *H01L 2924/10272* (2013.01); *H01L 2924/13055* (2013.01); *H01L 2924/15787* (2013.01); *H01L 2924/3512* (2013.01); *H02P 27/06* (2013.01)

(58) Field of Classification Search
    CPC .................. H01L 24/73; H01L 25/072; H01L 2224/32225; H01L 2224/40139; H01L 2224/73263; H01L 2924/13055; H01L 2924/15787; H01L 2924/3512; H01L 23/3121; H01L 23/49811; H01L 23/4334; H01L 23/49531; H01L 24/83; H01L 25/18; H01L 24/29; H02P 27/06; H02M 1/088; H02M 1/327; H02M 7/53871; H02M 7/003

See application file for complete search history.

(56) References Cited

U.S. PATENT DOCUMENTS

| | | | |
|---|---|---|---|
| 2016/0099194 A1* | 4/2016 | Gohara | B60L 50/51 |
| | | | 257/712 |
| 2017/0077044 A1* | 3/2017 | Soyano | H01L 23/48 |
| 2017/0278770 A1* | 9/2017 | Kato | H01L 23/4006 |
| 2018/0350713 A1 | 12/2018 | Murai et al. | |
| 2019/0088575 A1* | 3/2019 | Kato | H01L 23/49562 |
| 2021/0184023 A1* | 6/2021 | Hori | H01L 23/49811 |

OTHER PUBLICATIONS

An Office Action issued by the German Patent and Trademark Office on Jan. 15, 2025, which corresponds to German Patent Application No. 102022126046.1 and is related to U.S. Appl. No. 17/937,701.

* cited by examiner

SEMICONDUCTOR DEVICE COMPRISING SEMICONDUCTOR ELEMENT; INSULATING COMPONENT; LEAD ELECTRODE; AND FIRST BONDING MATERIAL, SECOND BONDING MATERIAL, THIRD BONDING MATERIAL, AND FOURTH BONDING MATERIAL MADE OF A SAME MATERIAL

BACKGROUND OF THE INVENTION

Field of the Invention

The present disclosure relates to a semiconductor device.

Description of the Background Art

It is desirable to improve heat dissipation of semiconductor elements and lead electrodes in semiconductor devices, due to increase in current capacity of the semiconductor devices.

For example, WO2017/130370 discloses a semiconductor device including: a semiconductor element; a lead electrode with one end of a lower surface being connected to an upper surface of the semiconductor element; a cooling mechanism disposed on the lower surface of the semiconductor element through a heat spreader; and a heat dissipation block disposed in thermal communication between the cooling mechanism and another end of the lower surface of the lead electrode. This structure improves the heat dissipation of the semiconductor element and the lead electrode without upsizing the product.

However, according to the technology described in WO2017/130370, if the height of the heat dissipation block is infinitesimally different from the total height of the semiconductor element, solder, the heat spreader, and the lead electrode, a component relatively prone to deformation in the semiconductor device is deformed. If an insulating layer disposed below the heat dissipation block is deformed and dielectric breakdown occurs, the semiconductor device malfunctions.

SUMMARY

The object of the present disclosure is to provide a technology for enabling reduction of the stress applied to an insulating component and enhancement of reliability in a semiconductor device.

A semiconductor device according to the present disclosure includes an insulating layer, a circuit pattern, a semiconductor element, an insulating component, and a lead electrode. The circuit pattern is disposed on an upper surface of the insulating layer. The semiconductor element is bonded to an upper surface of the circuit pattern through a first bonding material. The insulating component is bonded to the upper surface of the circuit pattern through a second bonding material. The lead electrode connects the semiconductor element to the insulating component. An upper surface of the semiconductor element is bonded to a lower surface of the lead electrode through a third bonding material. An upper surface of the insulating component is bonded to the lower surface of the lead electrode through a fourth bonding material. The first bonding material, the second bonding material, the third bonding material, and the fourth bonding material are made of a same material.

Adjustment of the thickness of the second bonding material for bonding the insulating component to the upper surface of the circuit pattern, and the thickness of the fourth bonding material for bonding the upper surface of the insulating component to the lower surface of the lead electrode can reduce the stress applied to the insulating component.

Since the first bonding material, the second bonding material, the third bonding material, and the fourth bonding material are made of the same material, the heating times required for the bonding can be reduced. Thus, the heat deterioration of the components of the semiconductor device can be prevented. This can enhance the reliability of the semiconductor device.

These and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1

[Structure of Semiconductor Device]

Figure 1:
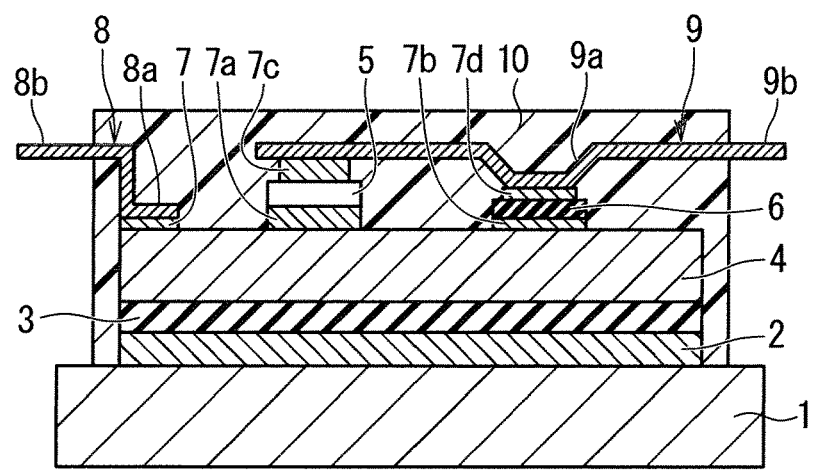
FIG. 1 schematically illustrates a cross-sectional view of a semiconductor device according to Embodiment 1.
Figure 2:
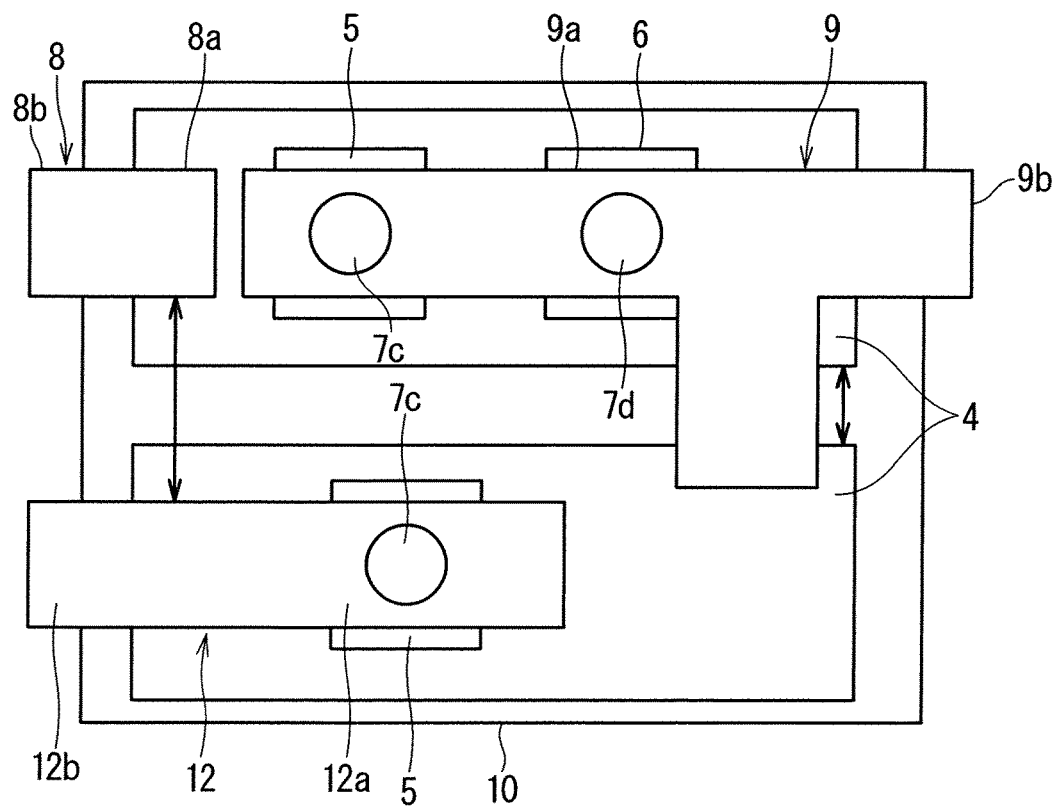
FIG. 2 schematically illustrates a top view of the semiconductor device according to Embodiment 1 when viewed from over a lead electrode included in the semiconductor device.

Embodiment 1 will be described hereinafter with reference to the drawings. FIG. 1 schematically illustrates a cross-sectional view of a semiconductor device 50 according to Embodiment 1. FIG. 2 schematically illustrates a top view of the semiconductor device 50 according to Embodiment 1 when viewed from over a lead electrode 9 included in the semiconductor device 50.

As illustrated in FIG. 1, the semiconductor device 50 includes a cooling mechanism 1, a metal pattern 2, an insulating layer 3, circuit patterns 4, semiconductor elements 5, an insulating component 6, lead electrodes 8 and 9, and a sealing resin 10.

The cooling mechanism 1 is mainly made of Al or Cu, is a structure having a fin structure inside, and has a water cooling function.

The metal pattern 2 is disposed on the upper surface of the cooling mechanism 1 through thermal grease (not illustrated). The metal pattern 2 is mainly made of copper. The metal pattern 2 made of a material with a high thermal conductivity can effectively dissipate the heat generated in the semiconductor elements 5, and increase the longevity of the semiconductor device 50.

The insulating layer 3 is disposed on the upper surface of the metal pattern 2. The insulating layer 3 is mainly made of AlN, $Al_2O_3$, or SiN. The circuit patterns 4 are disposed on the upper surface of the insulating layer 3. Application of a material with a high thermal conductivity as the insulating layer 3 can improve the heat dissipation from the circuit patterns 4 to the metal pattern 2 through the insulating layer 3. This can inhibit elevation of the temperature of the semiconductor elements 5, and increase the longevity of the semiconductor device 50.

The insulating layer 3 may be mainly made of a resin having a thermal conductivity higher than or equal to 10 W/m·K. The insulating layer 3 made of a deformation-resistant material with a high thermal conductivity can prevent cracks generated when, for example, the heat cycle infinitesimally deforms the components of the semiconductor device 50. This can make high heat dissipation compatible with high reliability. Moreover, such a material is less expensive.

An internal connector 8a of the lead electrode 8, the semiconductor element 5, and the insulating component 6 are bonded to the upper surface of one of the circuit patterns 4. The internal connector 8a of the lead electrode 8 is bonded to the upper surface of the circuit pattern 4 through a bonding material 7. The semiconductor element 5 is bonded to the upper surface of the circuit pattern 4 through a first bonding material 7a. The insulating component 6 is bonded to the upper surface of the circuit pattern 4 through a second bonding material 7b. The lead electrode 9 connecting the semiconductor element 5 to the insulating component 6 is bonded to the upper surface of the semiconductor element 5 and the upper surface of the insulating component 6 through a third bonding material 7c and a fourth bonding material 7d, respectively.

Thus, the second bonding material 7b and the fourth bonding material 7d are applied to the lower surface and the upper surface of the insulating component 6, respectively. The thicknesses of the second bonding material 7b and the fourth bonding material 7d are adjustable. Adjustment of the thicknesses of the second bonding material 7b and the fourth bonding material 7d to appropriate ones enables the second bonding material 7b and the fourth bonding material 7d to function as cushions of the insulating component 6. This can reduce the stress applied to the insulating component 6.

The insulating component 6 is disposed between an external connector 9b and a portion of an internal connector 9a of the lead electrode 9 to which the semiconductor element 5 is bonded. Furthermore, a portion of the internal connector 9a of the lead electrode 9 to which the insulating component 6 is bonded is depressed downward. The other portions of the lead electrode 9 are plate-shaped. The heat generated in the semiconductor element 5 is dissipated from the lower surface of the semiconductor element 5 to the circuit pattern 4. The heat is also conducted from the upper surface of the semiconductor element 5 to the lead electrode 9, and is dissipated from the lead electrode 9 to the circuit pattern 4 through the insulating component 6. This can inhibit elevation of the temperature of the semiconductor element 5 and the lead electrode 9.

The insulating component 6 is mainly made of Si, AlN, $Al_2O_3$, or SiN with an oxidized film, or a resin with a thermal conductivity higher than that of the sealing resin 10. Application a material with a high thermal conductivity as the insulating component 6 efficiently conducts the heat of the lead electrode 9 to the cooling mechanism 1 through the insulating component 6. This can inhibit elevation of the temperature of the semiconductor element 5 and the lead electrode 9. Moreover, the longevity of the semiconductor device 50 can be increased, and temperature characteristics of the semiconductor device 50 can be improved.

Since the first bonding material 7a, the second bonding material 7b, the third bonding material 7c, and the fourth bonding material 7d are made of the same material, the heating times required for the bonding can be reduced. Thus, the heat deterioration of the components of the semiconductor device 50 can be prevented. Specifically, the first bonding material 7a, the second bonding material 7b, the third bonding material 7c, and the fourth bonding material 7d are made of solder or silver. The first bonding material 7a, the second bonding material 7b, the third bonding material 7c, and the fourth bonding material 7d which are made of a material with a high thermal conductivity can effectively dissipate the heat to the upper surface and the lower surface of the semiconductor element 5, and from the lead electrode 9 to the cooling mechanism 1 through the insulating component 6. This can inhibit elevation of the temperature of the semiconductor element 5 and the lead electrode 9, increase the longevity of the semiconductor device 50, and improve the temperature characteristics of the semiconductor device 50. The bonding material 7 is also made of the same material as that of the first bonding material 7a, the second bonding material 7b, the third bonding material 7c, and the fourth bonding material 7d.

The lead electrodes 8 and 9 are mainly made of copper. The lead electrodes 8 and 9 made of a material with a high thermal conductivity can effectively dissipate the heat generated in the semiconductor element 5. Thus, the quality of the semiconductor device 50 is stabilized.

The cross-sectional area of the lead electrode 9 is sized so that the exothermic temperature of the lead electrode 9 subjected to a conductor resistance is lower than the exothermic temperature of the semiconductor element 5 when the semiconductor device 50 is driven. The following will describe this. Suppose that T1 denotes the exothermic temperature of the semiconductor element 5, and T2 denotes the exothermic temperature of the lead electrode 9. Satisfying the relationship T1>T2 dissipates the heat generated in the semiconductor element 5 to the cooling mechanism 1 through the lead electrode 9 and the insulating component 6. The relationship T1>T2 requires a relationship R1>R2, where R1 denotes a resistance value of the semiconductor element 5, and R2 denotes a resistance value of the lead electrode 9. Supposing that ρ denotes the resistivity of the lead electrode 9, L denotes the length of the lead electrode 9, and A denotes the cross-sectional area of the lead electrode 9, R2 is expressed by R2=ρ×L/A. Thus, increasing the cross-sectional area A of the lead electrode 9 satisfies the relationship R1>R2, that is, T1>T2.

As described above, increasing the cross-sectional area A of the lead electrode 9 dissipates the heat generated in the semiconductor element 5 to the cooling mechanism 1 through the lead electrode 9 and the insulating component 6. Since this reduces the temperature of the semiconductor element 5, the maximum temperature of the semiconductor device 50 is also reduced. Thus, the longevity of the semiconductor device 50 is increased, and operations of the semiconductor device 50 become stable.

The lead electrode 9 may have an inconstant width. Increasing the width of the current path more than those of the other portions in the lead electrode 9 can reduce the current density. Thus, an amount of the heat generated in the resistance of the lead electrode 9 can be reduced. This can inhibit elevation of the temperature of the semiconductor device 50.

A reverse-conducting insulated gate bipolar transistor (RC-IGBT) is used as the semiconductor element 5. This can reduce the area of the semiconductor elements 5. Thus, the semiconductor device 50 can be downsized. Since the RC-IGBT is always in an energized state, the temperature of the RC-IGBT tends to increase more than a semiconductor device including an IGBT chip and a diode chip. However, application of the structure according to Embodiment 1 enables dissipation of heat from the upper surface of the semiconductor element 5 through the lead electrode 9. Thus, the semiconductor device 50 can operate stably with elevation of the temperature being inhibited.

Furthermore, the semiconductor element 5 is made of SiC as a semiconductor material. Application of the semiconductor elements 5 with low losses can reduce the heat generated in the semiconductor elements 5. Thus, the maximum temperature of the semiconductor device 50 can be reduced, and the longevity of the semiconductor device 50 can be increased. Since the amount of power to be consumed in the semiconductor device 50 can be reduced, the energy can be saved.

The sealing resin 10 is an epoxy resin or gel, and seals portions of the metal pattern 2 except the lower surface, the insulating layer 3, the circuit patterns 4, the internal connectors 8a and 9a of the lead electrodes 8 and 9, the semiconductor elements 5, and the insulating component 6. The external connectors 8b and 9b of the lead electrodes 8 and 9 protrude from the sealing resin 10.5b As illustrated in FIG. 2, consider the semiconductor device 50 in which the two circuit patterns 4 are arranged in parallel and a lead electrode 12 is arranged in parallel with the lead electrode 8, where the lead electrode 12 and the lead electrode 8 are disposed on the respective circuit patterns 4. Since the sealing resin 10 can shorten insulation distances between the two circuit patterns 4 and between the lead electrode 8 and the lead electrode 12, the semiconductor device 50 can be downsized. Furthermore, the sealing resin 10 serves a role in protecting the semiconductor elements 5. Thus, the sealing resin 10 can cushion the semiconductor elements 5 from an external shock, and increase the longevity of the semiconductor device 50.

[Advantages]

As described above, the semiconductor device 50 according to Embodiment 1 includes: the insulating layer 3; the circuit pattern 4 on the upper surface of the insulating layer 3; the semiconductor element 5 bonded to the upper surface of the circuit pattern 4 through the first bonding material 7a; the insulating component 6 bonded to the upper surface of the circuit pattern 4 through the second bonding material 7b; and the lead electrode 9 connecting the semiconductor element 5 to the insulating component 6, wherein the upper surface of the semiconductor element 5 is bonded to the lower surface of the lead electrode 9 through the third bonding material 7c, the upper surface of the insulating component 6 is bonded to the lower surface of the lead electrode 9 through the fourth bonding material 7d, and the first bonding material 7a, the second bonding material 7b, the third bonding material 7c, and the fourth bonding material 7d are made of the same material.

Thus, adjustment of the thickness of the second bonding material 7b for bonding the insulating component 6 to the upper surface of the circuit pattern 4, and the thickness of the fourth bonding material 7d for bonding the upper surface of the insulating component 6 to the lower surface of the lead electrode 9 can reduce the stress applied to the insulating component 6.

Since the first bonding material 7a, the second bonding material 7b, the third bonding material 7c, and the fourth bonding material 7d are made of the same material, the heating times required for the bonding can be reduced. Thus, the heat deterioration of the components of the semiconductor device 50 can be prevented. This can enhance the reliability of the semiconductor device 50.

Furthermore, the lead electrode 9 includes the external connector 9b that can be connected to an external device. The insulating component 6 is disposed between the external connector 9b and a portion of the lead electrode 9 to which the semiconductor element 5 is bonded. Thus, the heat generated in the semiconductor element 5 is dissipated to the circuit pattern 4 through the insulating component 6. This can inhibit elevation of the temperature of the semiconductor element 5 and the lead electrode 9.

The semiconductor device 50 further includes the sealing resin 10 sealing a part of the lead electrode 9, the semiconductor element 5, and the insulating component 6, wherein the sealing resin 10 contains an epoxy resin or gel. Since the sealing resin 10 can shorten the insulation distance between the circuit pattern 4 and the lead electrode 9 in the semiconductor device 50, the semiconductor device 50 can be downsized. Furthermore, the sealing resin 10 serves a role in protecting the semiconductor elements 5. Thus, the sealing resin 10 can cushion the semiconductor elements 5 from an external shock, and increase the longevity of the semiconductor device 50.

The insulating component 6 contains Si, AlN, $Al_2O_3$, or SiN with an oxidized film, or a resin with a thermal conductivity higher than that of the sealing resin 10. This material efficiently conducts the heat of the lead electrode 9 to the cooling mechanism 1 through the insulating component 6. Thus, elevation of the temperature of the semiconductor element 5 and the lead electrode 9 can be inhibited. Moreover, the longevity of the semiconductor device 50 can be increased, and the temperature characteristics of the semiconductor device 50 can be improved.

Furthermore, the lead electrode 9 containing copper can effectively dissipate the heat generated in the semiconductor element 5. Thus, the quality of the semiconductor device 50 is stabilized.

Since the first bonding material 7a contains solder or silver, the second bonding material 7b, the third bonding material 7c, and the fourth bonding material 7d also contain solder or silver. This enables effective dissipation of the heat to the upper surface and the lower surface of the semiconductor element 5, and from the lead electrode 9 to the cooling mechanism 1 through the insulating component 6.

Thus, elevation of the temperature of the semiconductor element 5 and the lead electrode 9 can be inhibited. Moreover, the longevity of the semiconductor device 50 can be increased, and the temperature characteristics of the semiconductor device 50 can be improved.

The cross-sectional area of the lead electrode 9 is sized so that the exothermic temperature of the lead electrode 9 subjected to a conductor resistance is lower than the exothermic temperature of the semiconductor element 5 when the semiconductor device 50 is driven. Thus, the heat of the semiconductor element 5 is conducted to the lead electrode 9. Then, the temperature of the semiconductor element 5 is reduced. Consequently, the maximum temperature of the semiconductor device 50 is reduced. This leads to increase in the longevity of the semiconductor device 50, and stable operations of the semiconductor device 50.

The insulating layer 3 contains AlN, $Al_2O_3$, or SiN. Using an insulating layer with a high thermal conductivity as the insulating layer 3 can improve the heat dissipation from the circuit patterns 4 to the metal pattern 2. This can inhibit elevation of the temperature of the semiconductor device 50, and increase the longevity of the semiconductor device 50.

The insulating layer 3 contains a resin having a thermal conductivity higher than or equal to 10 W/m·K. Using an insulating layer made of a deformation-resistant resin with a high thermal conductivity as the insulating layer 3 can prevent cracks generated when, for example, the heat cycle infinitesimally deforms the components of the semiconductor device 50. This can make high heat dissipation compatible with high reliability in the semiconductor device 50.

The semiconductor device 50 further includes the metal pattern 2 disposed on a lower surface of the insulating layer 3, wherein the metal pattern 2 contains copper. The metal pattern 2 made of a material with a high thermal conductivity can effectively dissipate the heat generated in the semiconductor elements 5, and increase the longevity of the semiconductor device 50.

Since the lead electrode 9 has an inconstant width, increasing the width of the current path more than those of the other portions in the lead electrode 9 can reduce the current density. Since this can reduce the amount of heat generated in the conductor resistance of the lead electrode 9, elevation of the temperature of the semiconductor device 50 can be inhibited.

Since the semiconductor element 5 is an RC-IGBT, the area of the semiconductor elements 5 can be reduced. Thus, the semiconductor device 50 can be downsized. Since the RC-IGBT is always in an energized state, the temperature of the RC-IGBT tends to increase more than a semiconductor device including an IGBT chip and a diode chip. However, the heat can be dissipated from the upper surface of the semiconductor element 5 through the lead electrode 9. Thus, the semiconductor device 50 can operate stably with elevation of the temperature being inhibited.

Since the semiconductor element 5 is made of SiC as a semiconductor material, the heat generated in the semiconductor elements 5 can be reduced. Thus, the maximum temperature of the semiconductor device 50 can be reduced, and the longevity of the semiconductor device 50 can be increased. Since the amount of power to be consumed in the semiconductor device 50 can be reduced, the energy can be saved.

Embodiment 2

Figure 3:
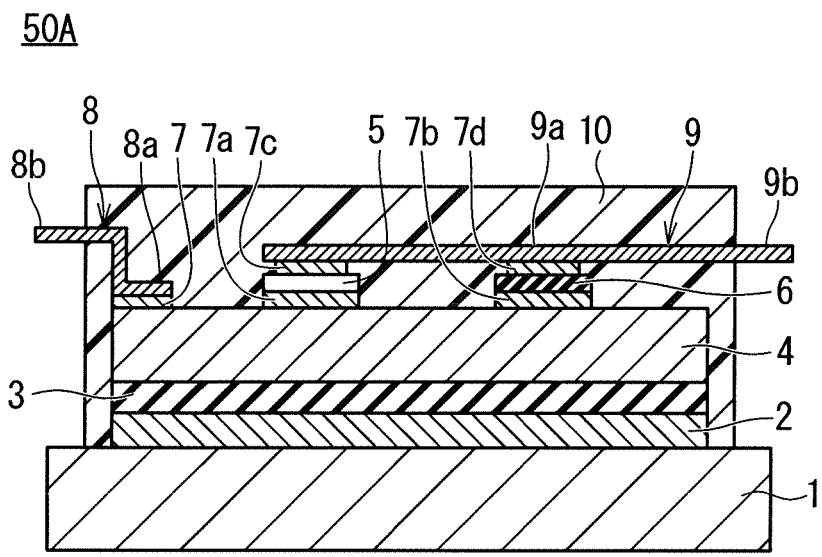
FIG. 3 schematically illustrates a cross-sectional view of a semiconductor device according to Embodiment 2.

Next, a semiconductor device 50A according to Embodiment 2 will be described. FIG. 3 schematically illustrates a cross-sectional view of the semiconductor device 50A according to Embodiment 2. In Embodiment 2, the same reference numerals are assigned to the same constituent elements described in Embodiment 1, and the description thereof will be omitted.

As illustrated in FIG. 3, the shape of the lead electrode 9 according to Embodiment 2 differs from that according to Embodiment 1. Specifically, the portion of the lead electrode 9 to which the insulating component 6 is bonded is depressed downward according to Embodiment 1, whereas the entirety of the lead electrode 9 is plate-shaped according to Embodiment 2.

As described above, the lead electrode 9 is plate-shaped in the semiconductor device 50A according to Embodiment 2. Although the stress may be applied to the insulating component 6 due to a machining error in a bending process according to Embodiment 1, using the plate-shaped lead electrode 9 as in Embodiment 2 eliminates the machining error. Thus, the stress to the insulating component 6 can be prevented.

Modifications of Embodiment 2

Figure 4:
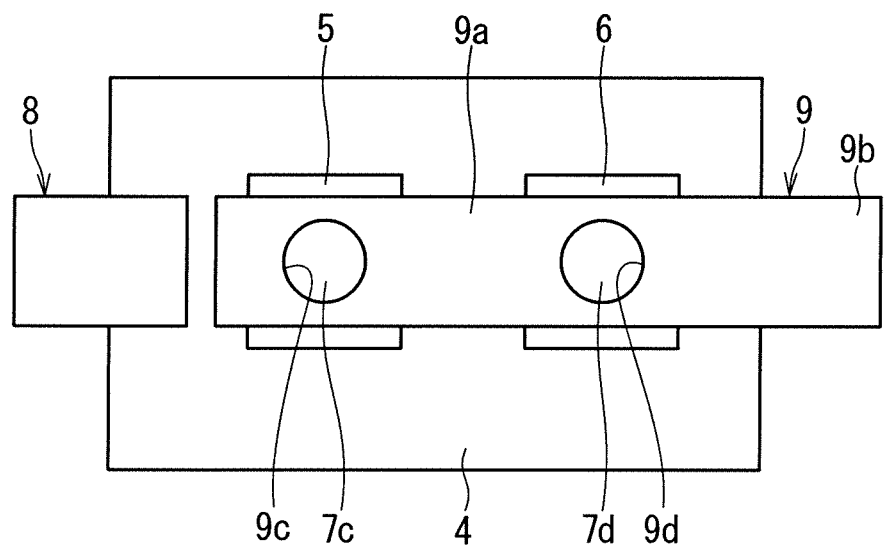
FIG. 4 schematically illustrates a top view of the semiconductor device according to Modification 1 of Embodiment 2 when viewed from over the lead electrode included in the semiconductor device.
Figure 5:
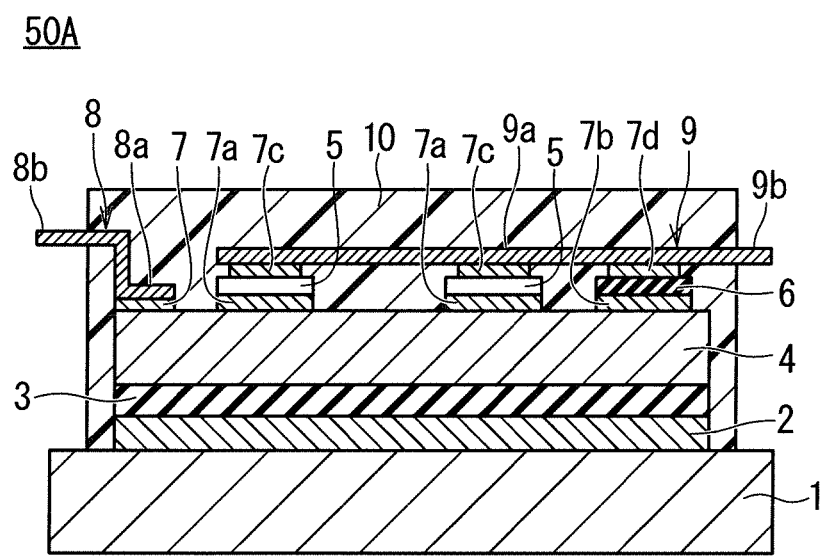
FIG. 5 schematically illustrates a cross-sectional view of the semiconductor device according to Modification 2 of Embodiment 2.
Figure 6:
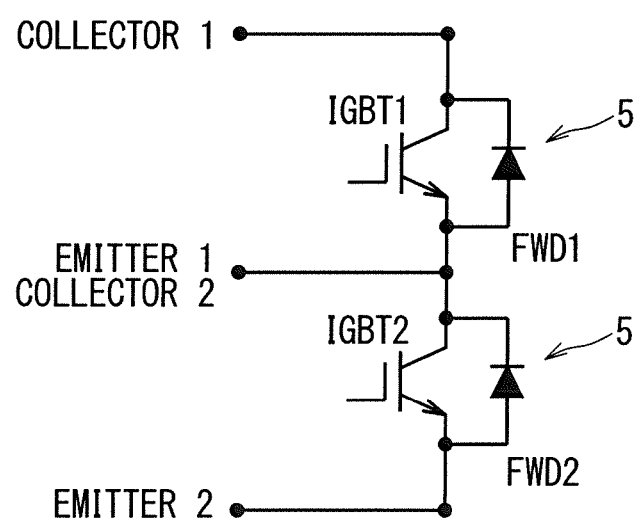
FIG. 6 is a circuit diagram illustrating a structure of the semiconductor device according to Modification 3 of Embodiment 2.
Figure 7:
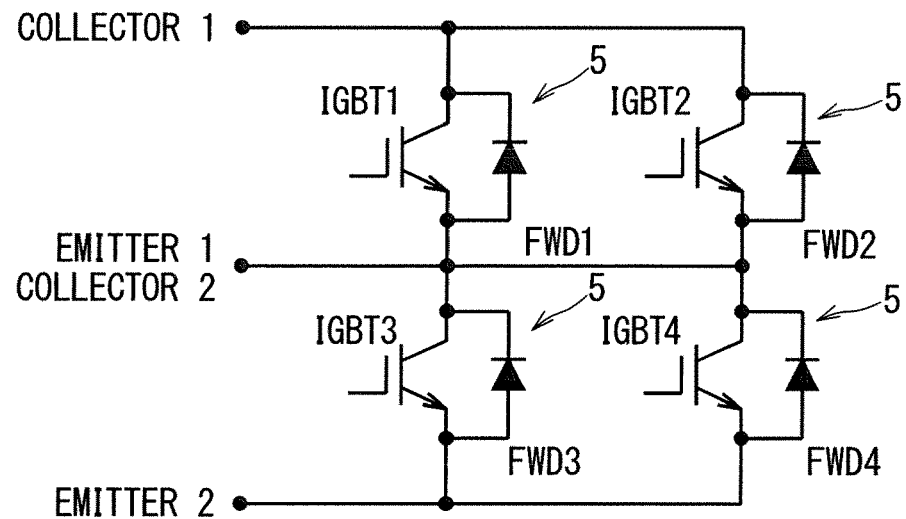
FIG. 7 is a circuit diagram illustrating a structure of the semiconductor device according to Modification 4 of Embodiment 2.
Figure 8:
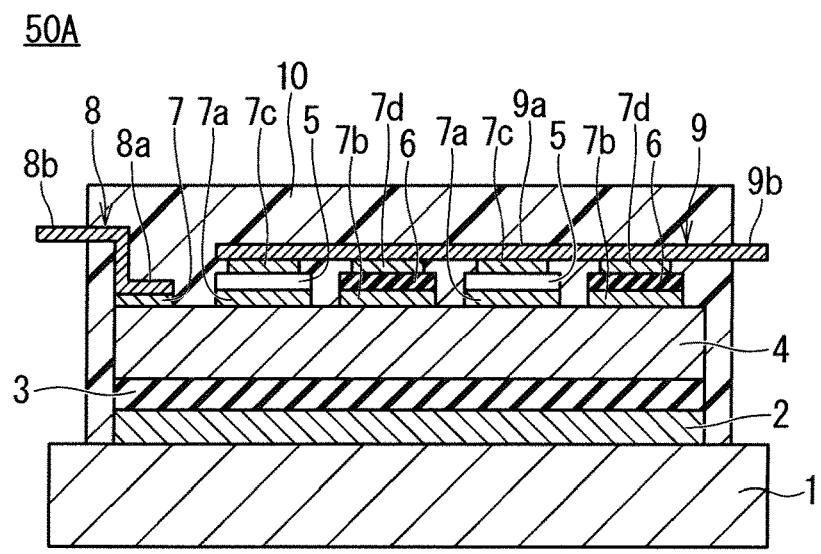
FIG. 8 schematically illustrates a cross-sectional view of the semiconductor device according to Modification 5 of Embodiment 2.
Figure 9A:
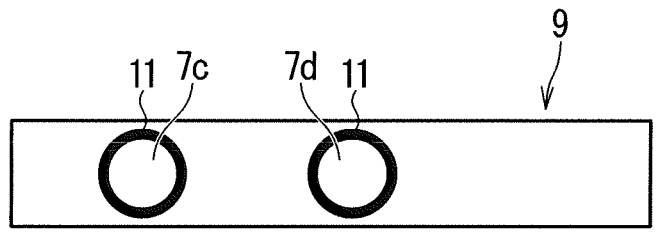
FIG. 9A illustrates a top view of an example of the lead electrode included in the semiconductor device according to Modification 6 of Embodiment 2.
Figure 9B:
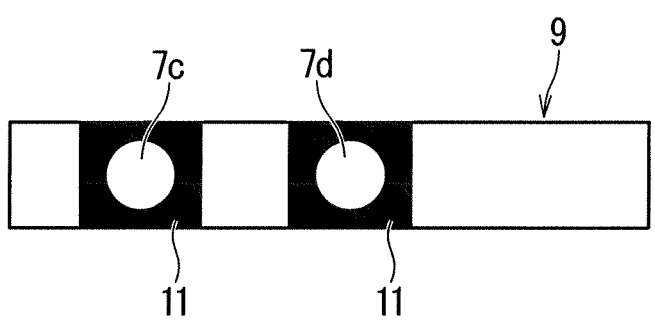
FIG. 9B illustrates a top view of another example of the lead electrode included in the semiconductor device according to Modification 6 of Embodiment 2.

Next, modifications of Embodiment 2 will be described. FIG. 4 schematically illustrates a top view of the semiconductor device 50A according to Modification 1 of Embodiment 2 when viewed from over the lead electrode 9 included in the semiconductor device 50A. FIG. 5 schematically illustrates a cross-sectional view of the semiconductor device 50A according to Modification 2 of Embodiment 2. FIG. 6 is a circuit diagram illustrating a structure of the semiconductor device 50A according to Modification 3 of Embodiment 2. FIG. 7 is a circuit diagram illustrating a structure of the semiconductor device 50A according to Modification 4 of Embodiment 2. FIG. 8 schematically illustrates a cross-sectional view of the semiconductor device 50A according to Modification 5 of Embodiment 2. FIG. 9A illustrates a top view of an example of the lead electrode 9 included in the semiconductor device 50A according to Modification 6 of Embodiment 2. FIG. 9B illustrates a top view of another example of the lead electrode 9 included in the semiconductor device 50A according to Modification 6 of Embodiment 2.

As illustrated in FIG. 4, a through hole 9c may be formed in a first bonding portion of the lead electrode 9 to which the semiconductor element 5 is bonded, and a through hole 9d may be formed in a second bonding portion of the lead electrode 9 to which the insulating component 6 is bonded. The through hole 9c and the through hole 9d have diameters shorter than the first bonding portion and the second bonding portion, respectively. Since the third bonding material 7c and the fourth bonding material 7d are applied to the through hole 9c and the through hole 9d, respectively, the through holes 9c and 9d can prevent the spread of the third bonding material 7c and the fourth bonding material 7d beyond the bonding portions, and inhibit the conduction of electricity to portions other than portions requiring connection. This can enhance the reliability of the semiconductor device 50A.

As illustrated in FIG. 5, the semiconductor device 50A may include a plurality of semiconductor elements 5 (for example, two semiconductor elements 5). Since this can increase a voltage and an amount of current that can be applied to the semiconductor device 50A, the semiconductor device 50A can produce high output.

As illustrated in FIGS. 6 and 7, the plurality of semiconductor elements 5 may be arranged in parallel. The semiconductor element 5 includes a set of an IGBT and a free-wheeling diode (FWD). For example, with consideration given to the heat generated between a collector 1 and an emitter 1, driving an IGBT 1, a FWD 1, an IGBT 2, and a FWD 2 as illustrated in FIG. 7 can disperse the portions generating the heat more than solely driving the IGBT 1 and the FWD 1 as illustrated in FIG. 6. Thus, the maximum temperature of the semiconductor device 50 can be reduced, and the semiconductor device 50 can operate stably.

As illustrated in FIG. 8, the semiconductor device 50A may include a plurality of insulating components 6 (for example, two insulating components 6). Since the heat generated in the semiconductor elements 5 is dissipated to the cooling mechanism 1 through the lead electrode 9 and the insulating components 6, the plurality of insulating components 6 can improve the heat dissipation and increase the longevity of the semiconductor device 50A.

As illustrated in FIGS. 9A and 9B, roughened portions 11 whose surfaces are rougher than areas other than peripheries of the through holes 9c and 9d in the lead electrode 9 may be formed around the peripheries of the through holes 9c and 9d in the lead electrode 9.

Specifically, the annular roughened portions 11 may be formed around the peripheries of the through holes 9c and 9d on the lower surface of the lead electrode 9 as illustrated in FIG. 9A. Alternatively, the rectangular roughened portions 11 including the peripheries of the through holes 9c and 9d may be formed on the lower surface of the lead electrode 9 as illustrated in FIG. 9B.

If the fourth bonding material 7d on the upper surface of the insulating component 6 excessively wets away, contact of the fourth bonding material 7d with the second bonding material 7b on the lower surface of the insulating component 6 causes the insulating component 6 to lose the insulation properties. The roughened portions 11 formed around the peripheries of the through holes 9c and 9d on the lower surface of the lead electrode 9 can prevent the fourth bonding material 7d from excessively wetting away, and improve the insulation properties of the insulating component 6.

The details of the modifications of Embodiment 2 can be combined with other Embodiments.

Embodiment 3

Figure 10:
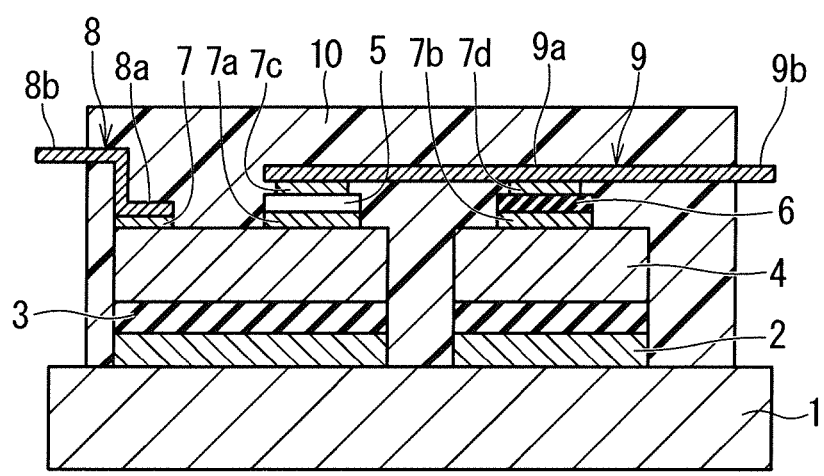
FIG. 10 schematically illustrates a cross-sectional view of a semiconductor device according to Embodiment 3.

Next, a semiconductor device 50B according to Embodiment 3 will be described. FIG. 10 schematically illustrates a cross-sectional view of the semiconductor device 50B according to Embodiment 3. In Embodiment 3, the same reference numerals are assigned to the same constituent elements described in Embodiments 1 and 2, and the description thereof will be omitted.

As illustrated in FIG. 10, the semiconductor device 50B according to Embodiment 3 includes a plurality of structures (for example, two structures) each including the metal pattern 2, the insulating layer 3, and the circuit pattern 4. The semiconductor element 5 and the insulating component 6 are bonded to the respective upper surfaces of the circuit patterns 4. The structure according to Embodiment 3 can be combined with those of other Embodiments.

As described above, the semiconductor device 50B according to Embodiment 3 includes a plurality of the circuit patterns 4, wherein the semiconductor element 5 and the insulating component 6 are bonded to respective upper surfaces of two of the plurality of circuit patterns 4. This structure eliminates interference of the heat conducted to each of the circuit patterns 4. Thus, the heat dissipation of the semiconductor device 50B can be improved.

Embodiment 4

Figure 11:
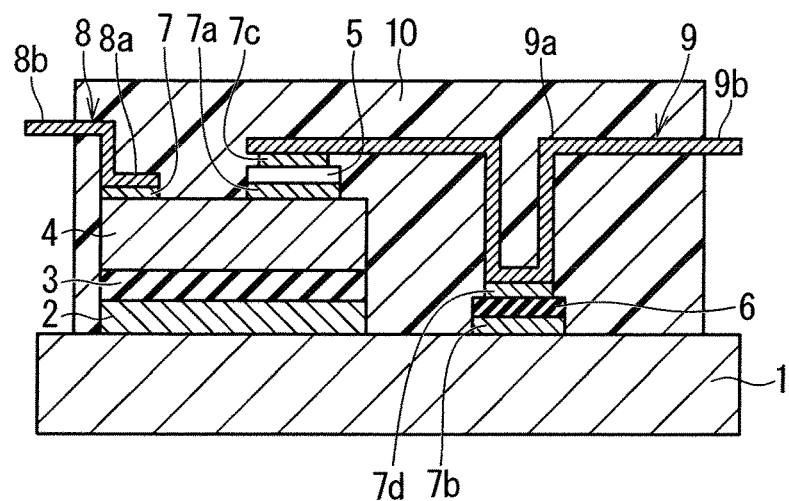
FIG. 11 schematically illustrates a cross-sectional view of a semiconductor device according to Embodiment 4.

Next, a semiconductor device 50C according to Embodiment 4 will be described. FIG. 11 schematically illustrates a cross-sectional view of the semiconductor device 50C according to Embodiment 4. In Embodiment 4, the same reference numerals are assigned to the same constituent elements described in Embodiments 1 to 3, and the description thereof will be omitted.

As illustrated in FIG. 11, the insulating component 6 according to Embodiment 4 is bonded not to the upper surface of the circuit pattern 4 but to the upper surface of the cooling mechanism 1 through the second bonding material 7b. Furthermore, a portion of the internal connector 9a of the lead electrode 9 to which the insulating component 6 is bonded is depressed downward. The other portions of the lead electrode 9 are plate-shaped.

As described above, the semiconductor device 50C according to Embodiment 4 includes: the cooling mechanism 1; the insulating layer 3 disposed above the cooling mechanism 1; the circuit pattern 4 disposed on an upper surface of the insulating layer 3; the semiconductor element 5 bonded to an upper surface of the circuit pattern 4 through the first bonding material 7a; the insulating component 6 bonded to an upper surface of the cooling mechanism 1 through the second bonding material 7b; and the lead electrode 9 connecting the semiconductor element 5 to the insulating component 6, wherein an upper surface of the semiconductor element 5 is bonded to a lower surface of the lead electrode 9 through the third bonding material 7c, an upper surface of the insulating component 6 is bonded to the lower surface of the lead electrode 9 through the fourth bonding material 7d, and the first bonding material 7a, the second bonding material 7b, the third bonding material 7c, and the fourth bonding material 7d are made of the same material.

Since the heat generated in the semiconductor element 5 can be dissipated directly to the cooling mechanism 1 without passing through the insulating layer 3, elevation of the temperature of the semiconductor device 50C can be further inhibited.

Embodiment 5

Figure 12:
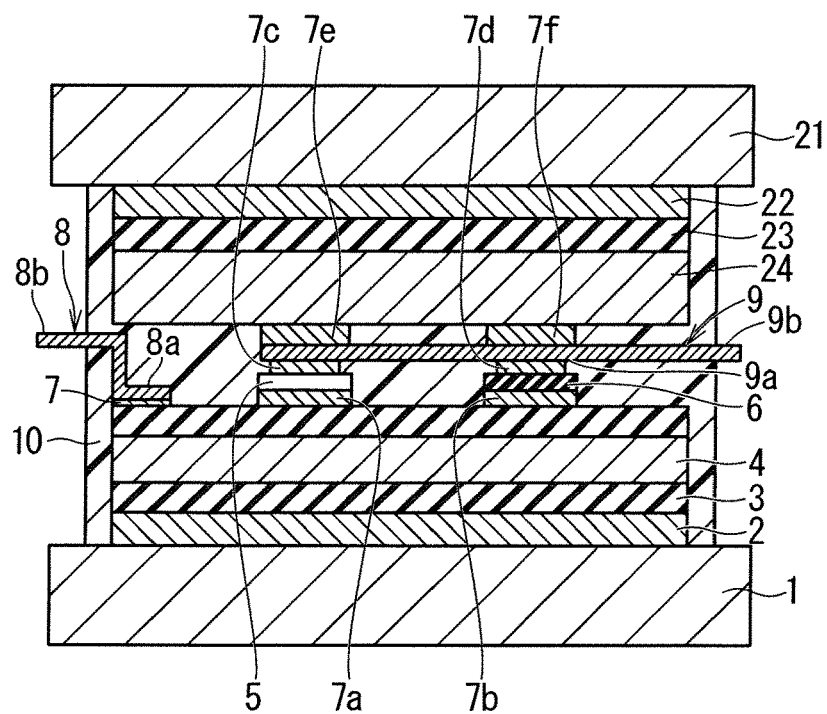
FIG. 12 schematically illustrates a cross-sectional view of a semiconductor device according to Embodiment 5.

Next, a semiconductor device 50D according to Embodiment 5 will be described. FIG. 12 schematically illustrates a cross-sectional view of the semiconductor device 50D according to Embodiment 5. In Embodiment 5, the same reference numerals are assigned to the same constituent elements described in Embodiments 1 to 4, and the description thereof will be omitted.

As illustrated in FIG. 12, the semiconductor device 50D according to Embodiment 5 further includes a circuit pattern 24, an insulating layer 23, a metal pattern 22, and a cooling mechanism 21 above the lead electrode 9 in addition to the structure according to Embodiment 2.

An upper surface portion of the lead electrode 9 to which the semiconductor element 5 is bonded and an upper surface portion of the lead electrode 9 to which the insulating component 6 is bonded are bonded to a lower surface of the circuit pattern 24 through a fifth bonding material 7e and a sixth bonding material 7f, respectively. The fifth bonding material 7e and the sixth bonding material 7f are made of the same material as that of the first bonding material 7a, the second bonding material 7*b*, the third bonding material 7*c*, and the fourth bonding material 7*d*.

As described above, the semiconductor device 50D according to Embodiment 5 further includes: the insulating layer 23 different from the insulating layer 3; and the circuit pattern 24 different from the circuit pattern 4, the circuit pattern 24 being disposed on a lower surface of the insulating layer 23, wherein the circuit pattern 24 is disposed above the lead electrode 9, an upper surface portion of the lead electrode 9 to which the semiconductor element 5 is bonded and an upper surface portion of the lead electrode 9 to which the insulating component 6 is bonded are bonded to the circuit pattern 24 through the fifth bonding material 7*e* and the sixth bonding material 7*f*, respectively, and the first bonding material, the second bonding material, the third bonding material, the fourth bonding material, the fifth bonding material, and the sixth bonding material are made of the same material.

Thus, the heat generated in the semiconductor element 5 is also spread above the lead electrode 9 through the lead electrode 9. This can further improve the heat dissipation of the semiconductor device 50D. Since elevation of the temperature of the semiconductor device 50D can be further inhibited, the longevity of the semiconductor device 50D can be increased.

Embodiment 6

Embodiment 6 will describe a power conversion device to which the semiconductor devices 50 to 50D according to Embodiments 1 to 5 are applied. Although application of the semiconductor devices 50 to 50D according to Embodiments 1 to 5 is not limited to specific power conversion devices, Embodiment 6 will describe application of the semiconductor devices 50 to 50D according to Embodiments 1 to 5 to a three-phase inverter.

Figure 13:
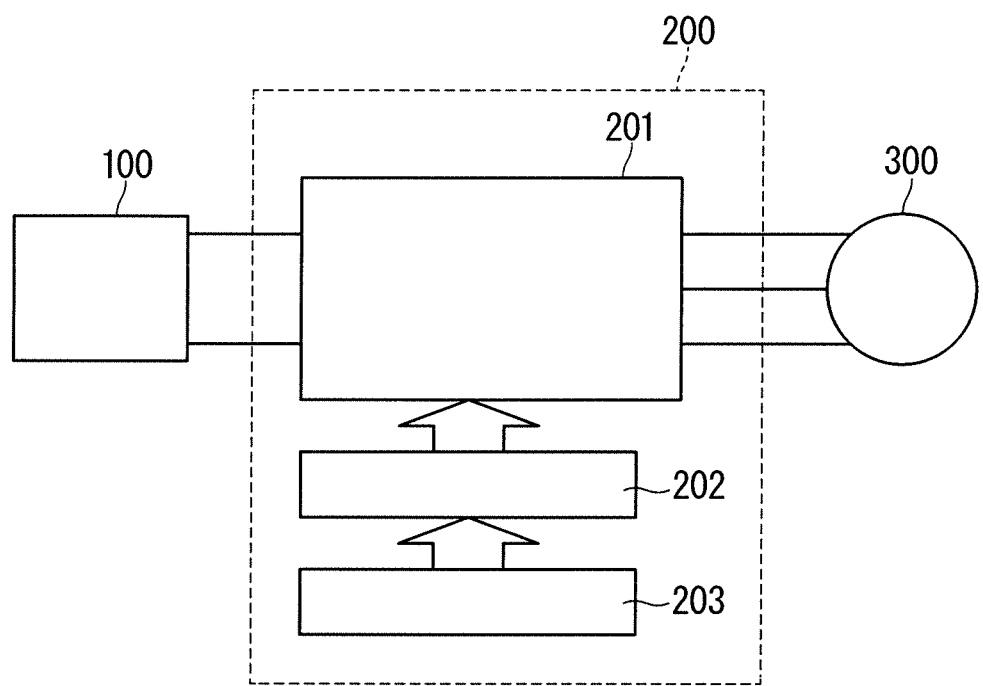
FIG. 13 is a block diagram illustrating a configuration of a power conversion system to which a power conversion device according to Embodiment 6 is applied.

FIG. 13 is a block diagram illustrating a configuration of a power conversion system to which a power conversion device 200 according to Embodiment 6 is applied.

The power conversion system illustrated in FIG. 13 includes a power supply 100, the power conversion device 200, and a load 300. The power supply 100, which is a DC power supply, supplies a DC power to the power conversion device 200. The power supply 100 may include various components such as a DC system, a solar battery, a rechargeable battery, a rectifying circuit connected to an AC system, or an AC/DC converter. The power supply 100 may include a DC/DC converter which converts the DC power output from a DC system into a predetermined power.

The power conversion device 200, which is a three-phase inverter connected between the power supply 100 and the load 300, converts the DC power supplied from the power supply 100 into the AC power to supply the AC power to the load 300. As illustrated in FIG. 13, the power conversion device 200 includes a main conversion circuit 201 that converts the DC power into the AC power, a drive circuit 202 that outputs a driving signal for driving each switching element in the main conversion circuit 201, and a control circuit 203 that outputs, to the drive circuit 202, a control signal for controlling the drive circuit 202.

The load 300 is a three-phase electrical motor driven by the AC power supplied from the power conversion device 200. The load 300 is not limited to specific use but is an electrical motor mounted on various types of electrical devices. Thus, the load 300 is used as an electrical motor for, for example, a hybrid car, an electrical car, a rail vehicle, an elevator, or air-conditioning equipment.

The power conversion device 200 will be described in detail hereinafter. The main conversion circuit 201 includes switching elements and free-wheeling diodes (not illustrated). Switching of the switching element causes the DC power supplied from the power supply 100 to be converted into the AC power. The AC power is then supplied to the load 300. The specific circuit configuration of the main conversion circuit 201 is of various types. The main conversion circuit 201 according to Embodiment 6 is a three-phase full-bridge circuit having two levels, and includes six switching elements and six free-wheeling diodes anti-parallel connected to the respective switching elements. Any one of the semiconductor devices 50 to 50D according to Embodiments 1 to 5 is applied to each of the switching elements of the main conversion circuit 201. The six switching elements form three pairs of upper and lower arms in each pair of which the two switching elements are serially connected to each other. The three pairs of upper and lower arms form the respective phases (U-phase, V-phase, and W-phase) of the full-bridge circuit. Output terminals of the respective pairs of upper and lower arms, i.e., three output terminals of the main conversion circuit 201 are connected to the load 300.

The drive circuit 202 generates driving signals for driving the switching elements of the main conversion circuit 201, and supplies the driving signals to control electrodes of the switching elements of the main conversion circuit 201. Specifically, the drive circuit 202 outputs, to a control electrode of each of the switching elements in accordance with the control signal from the control circuit 203 to be described hereinafter, the driving signal for switching the switching element to an ON state and the driving signal for switching the switching element to an OFF state. The driving signal is a voltage signal (ON signal) equal to or higher than a threshold voltage of the switching element when the switching element is kept in the ON state. The driving signal is a voltage signal (OFF signal) equal to or lower than the threshold voltage of the switching element when the switching element is kept in the OFF state.

The control circuit 203 controls the switching elements of the main conversion circuit 201 to supply a desired power to the load 300. Specifically, the control circuit 203 calculates a time (ON time) when each of the switching elements of the main conversion circuit 201 needs to enter the ON state, based on the power which needs to be supplied to the load 300. For example, the main conversion circuit 201 can be controlled by performing PWN control for modulating the ON time of the switching elements in accordance with the voltage which needs to be output. Then, the control circuit 203 outputs a control instruction (control signal) to the drive circuit 202 so that the drive circuit 202 outputs the ON signal to the switching element which needs to enter the ON state and outputs the OFF signal to the switching element which needs to enter the OFF state at each time. The drive circuit 202 outputs the ON signal or the OFF signal as the driving signal to the control electrode of each of the switching elements in accordance with this control signal.

Since the semiconductor devices 50 to 50D according to Embodiments 1 to 5 are applied to the switching elements of the main conversion circuit 201 in the power conversion device 200 according to Embodiment 6, the stress applied to the insulating layer 3 disposed below the insulating component 6 can be reduced, and the reliability of the semiconductor devices 50 to 50D can be enhanced. This can enhance the reliability of the power conversion device 200.

Although Embodiment 6 describes an example of applying the semiconductor devices 50 to 50D according to Embodiments 1 to 5 to a three-phase inverter having two levels, the semiconductor devices 50 to 50D according to Embodiments 1 to 5 are applicable not limited to the three-phase inverter but to various power converters. Although Embodiment 6 describes the power conversion device having the two levels, the power conversion device may have three or multiple levels. The semiconductor devices 50 to 50D according to Embodiments 1 to 5 may be applied to a single-phase inverter when the power is supplied to a single-phase load. When the power is supplied to, for example, a DC load, the semiconductor devices 50 to 50D according to Embodiments 1 to 5 can be also applied to a DC/DC converter or an AC/DC converter.

The load of the power conversion device to which the semiconductor devices 50 to 50D according to Embodiments 1 to 5 are applied is not limited to the electrical motor as described above. The power conversion device can also be used as a power-supply device of an electrical discharge machine, a laser beam machine, an induction heat cooking device, or a non-contact power feeding system, and can be further used as a power conditioner of, for example, a solar power system or an electricity storage system.

Embodiments above can be freely combined, and appropriately modified or omitted.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device, comprising:
an insulating layer;
a circuit pattern disposed on an upper surface of the insulating layer;
a semiconductor element bonded to an upper surface of the circuit pattern through a first bonding material;
an insulating component bonded to the upper surface of the circuit pattern through a second bonding material; and
a lead electrode connecting the semiconductor element to the insulating component,
wherein an upper surface of the semiconductor element is bonded to a lower surface of the lead electrode through a third bonding material,
an upper surface of the insulating component is bonded to the lower surface of the lead electrode through a fourth bonding material,
the first bonding material, the second bonding material, the third bonding material, and the fourth bonding material are made of a same material, and
the insulating component is an insulator.

2. A semiconductor device, comprising:
a cooling mechanism;
an insulating layer disposed above the cooling mechanism;
a circuit pattern disposed on an upper surface of the insulating layer;
a semiconductor element bonded to an upper surface of the circuit pattern through a first bonding material;
an insulating component bonded to an upper surface of the cooling mechanism through a second bonding material; and
a lead electrode connecting the semiconductor element to the insulating component,
wherein an upper surface of the semiconductor element is bonded to a lower surface of the lead electrode through a third bonding material,
an upper surface of the insulating component is bonded to the lower surface of the lead electrode through a fourth bonding material,
the first bonding material, the second bonding material, the third bonding material, and the fourth bonding material are made of a same material, and
the insulating component is an insulator.

3. The semiconductor device according to claim 1,
wherein the lead electrode includes an external connector that can be connected to an external device, and
the insulating component is disposed between the external connector and a portion of the lead electrode to which the semiconductor element is bonded.

4. The semiconductor device according to claim 2,
wherein the lead electrode includes an external connector that can be connected to an external device, and
the insulating component is disposed between the external connector and a portion of the lead electrode to which the semiconductor element is bonded.

5. The semiconductor device according to claim 1, further comprising
a sealing resin sealing a part of the lead electrode, the semiconductor element, and the insulating component,
wherein the insulating component contains Si, AlN, $Al_2O_3$, or SiN with an oxidized film, or a resin with a thermal conductivity higher than a thermal conductivity of the sealing resin.

6. The semiconductor device according to claim 2, further comprising a sealing resin sealing a part of the lead electrode, the semiconductor element, and the insulating component,
wherein the insulating component contains Si, AlN, $Al_2O_3$, or SiN with an oxidized film, or a resin with a thermal conductivity higher than a thermal conductivity of the sealing resin.

7. The semiconductor device according to claim 1,
wherein the lead electrode contains copper.

8. The semiconductor device according to claim 2,
wherein the lead electrode contains copper.

9. The semiconductor device according to claim 1,
wherein the first bonding material contains solder or silver.

10. The semiconductor device according to claim 2,
wherein the first bonding material contains solder or silver.

11. The semiconductor device according to claim 1,
wherein a cross-sectional area of the lead electrode is sized so that an exothermic temperature of the lead electrode subjected to a conductor resistance is lower than an exothermic temperature of the semiconductor element when the semiconductor device is driven.

12. The semiconductor device according to claim 2,
wherein a cross-sectional area of the lead electrode is sized so that an exothermic temperature of the lead electrode subjected to a conductor resistance is lower than an exothermic temperature of the semiconductor element when the semiconductor device is driven.

13. The semiconductor device according to claim 1, comprising a plurality of insulating components including the insulating component.

14. The semiconductor device according to claim 2, comprising a plurality of insulating components including the insulating component.

15. The semiconductor device according to claim 1,
wherein the lead electrode has an inconstant width.

16. The semiconductor device according to claim 2,
wherein the lead electrode has an inconstant width.

17. The semiconductor device according to claim 1, wherein the semiconductor element is a reverse-conducting insulated gate bipolar transistor.

18. The semiconductor device according to claim 2, wherein the semiconductor element is a reverse-conducting insulated gate bipolar transistor.

19. The semiconductor device according to claim 1, wherein the semiconductor element contains SiC as a semiconductor material.

20. The semiconductor device according to claim 2, wherein the semiconductor element contains SiC as a semiconductor material.

21. The semiconductor device according to claim 1, wherein the insulating component is configured to prevent current from passing through a direct path through the lead electrode, fourth bonding material, insulating component, second bonding material, and circuit pattern.

22. The semiconductor device according to claim 2, wherein the insulating component is configured to prevent current from passing through a direct path through the lead electrode, fourth bonding material, insulating component, second bonding material, and circuit pattern.

* * * * *